United States Patent [19]

Jesmanowicz et al.

[11] Patent Number: 5,603,322
[45] Date of Patent: Feb. 18, 1997

[54] TIME COURSE MRI IMAGING OF BRAIN FUNCTIONS

[75] Inventors: Andrzej Jesmanowicz, Wauwatosa; Peter A. Bandettini, Whitefish Bay; James S. Hyde, Dousman; Eric C. Wong, Wauwatosa, all of Wis.

[73] Assignee: MCW Research Foundation, Milwaukee, Wis.

[21] Appl. No.: 365,371

[22] Filed: Dec. 27, 1994

Related U.S. Application Data

[62] Division of Ser. No. 5,723, Jan. 19, 1994.

[51] Int. Cl.$^6$ .................................................... A61B 5/055
[52] U.S. Cl. ........................................ 128/653.2; 324/309
[58] Field of Search ............................ 128/653.2, 653.3; 324/307, 309; 364/413.13, 413.19, 413.22

[56] References Cited

PUBLICATIONS

Dynamic MR Imaging of Human Brain Oxygenation During Rest and Photic Stimulation, *JMRI* 1992: 2:501–505.

Dynamic Magnetic Resonance Imaging of Human Brain Activity Diring Primary Sensory Stimulation, *Proc. Natl. Acad. Sci. USA*, vol. 89, pp. 5675–5679m Jun. 1992.

Intrinsic Signal Changes Accompanying Sensory Stimulation: Functional Brain Mapping Using MRI, *Proc. Natl. Acad. Sci. USA*, vol. 89, pp. 5951–5955, Jun. 1992.

*Primary Examiner*—Ruth S. Smith
*Attorney, Agent, or Firm*—Quarles & Brady

[57] ABSTRACT

An EPI pulse sequence is performed by an NMR system which acquires 128 images of the brain over a time interval during which the subject performs a function or is stimulated. The acquired time course NMR data is displayed in different ways for analysis. Four different methods for producing brain function images from the NMR data are described.

9 Claims, 6 Drawing Sheets

TIME COURSE MRI IMAGING OF BRAIN FUNCTIONS

This is division of application Se. No. 08/005,723 filed Jan. 19, 1994.

BACKGROUND OF THE INVENTION

The field of the invention is nuclear magnetic resonance imaging methods and systems. More particularly, the invention relates to the production of brain function images Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped" into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_O$, but which have a gradient along the respective x, y and z axes. By controlling the strength of these gradients during each NMR cycle, the spatial distribution of spin excitation can be controlled and the location of the resulting NMR signals can be identified.

The concept of acquiring NMR image data in a short time period has been known since 1977 when the echo-planar pulse sequence was proposed by Peter Mansfield (J. Phys. C.10: L55–L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. The advantages of echo-planar imaging ("EPI") are well-known, and there has been a long felt need for apparatus and methods which will enable EPI to be practiced in a clinical setting. Echo-planar pulse sequences are disclosed in U.S. Pat. Nos. 4,678,996; 4,733,188; 4,716,369; 4,355,282; 4,588,948 and 4,752,735.

The imaging of brain functions with magnetic resonance imaging systems has been done using fast pulse sequences. As described by J. Frahm et al in "Dynamic MR Imaging of Human Brain Oxygenation During Rest and Photic Stimulation", *JMRI* 1992:2:501–505; K. Kwong et al in "Dynamic Magnetic Resonance Imaging of Human Brain Activity During Primary Sensory Stimulation" *Proc. Natl. Acad. Sci USA* Vol. 89, pp 5675–5679, June 1992 Neurobiology; and S. Ogawa et al, "Intrinsic Signal Changes Accompanying Sensory Stimulation: Functional Brain Mapping Using MRI", *Proc. Natl Acad. Sci USA* Vol. 89, pp. 5951–5955, June 1992 Neurobiology, these prior methods use a difference technique in which a series of image data sets are acquired with an EPI pulse sequence while a particular function is being performed by the patient, and a baseline image data set is acquired with no patient activity. The baseline data set is subtracted from the series of data sets to produce difference images that reveal those parts of the brain that were active during the performance of the function. These difference images may be displayed in sequence to provide a cine display of the activity-induced brain functions.

The difference in NMR signal level produced By regions of the brain that are active and those that are inactive is very small. The difference is believed to result from the increase in oxygen supply to active portions of the brain which decreases the susceptibility differential between vessels and surrounding tissues. This allows an increase in the phase coherence of spins and a resulting increase in NMR signal level. However, this difference in signal level is only 2 to 4 percent (at 1.5 Tesla) and is masked by system noise, and artifacts caused by patient motion, brain pulsatility, blood flow and CSF flow.

SUMMARY OF THE INVENTION

The present invention relates to the acquisition, processing and displaying of time course acquired MRI data of the brain for the purpose of locating regions in the brain that are active in response to an applied stimulus. More particularly, the invention includes acquiring a series of MRI image data sets of a subject's brain using fast NMR pulse sequences repeated over a period of time during which a stimulus is applied to the subject and removed in a selected temporal pattern; displaying an anatomical image of the subject's brain using acquired MRI image data along with a cursor which selects one or more pixels in the anatomical image; and displaying in graphic form the magnitude of the NMR signals acquired for selected pixels in the series of MRI image data sets. By moving the cursor over the anatomical image, the time course acquired MRI data from various regions of the brain can be displayed as a graph. The graphic representation of the changes in NMR signal intensity over the time period clearly reveals the selected temporal pattern in which the stimulus is applied, and reveals active regions of the brain.

Another aspect of the invention is the further processing of time course acquired MRI data to produce a brain function image. The graphic display of the NMR signal in active regions of the brain enables the neurologist to accurately select two MRI image data sets in the series which were acquired when the stimulus was applied and when it was removed. These two selected MRI image data sets may then be processed by subtracting signals for corresponding pixels to produce a difference MRI image data set that is displayed to indicate brain activity. This difference image may be superimposed over the directly registered anatomical image and color coded to indicate intensity of activity.

Another aspect of the invention is to improve the quality of MRI brain activity images. The neurologist may input a reference pattern or select as a reference pattern the time varying NMR data for one voxel which is observed to follow the selected stimulation pattern. The degree of correlation between the selected reference pattern and the time varying NMR signals for each of the other voxels in the MRI data set is then calculated and the results displayed as a brain function image. In voxel locations where the correlation is high, brain activity is high and where it is low there is little or no correlation. The resulting brain function image may be superimposed on the anatomical image as variations in brightness or color.

Yet another aspect of the invention is to collect MRI image data sets and produce brain activity images therefrom which separately show brain activity from one of a plurality of stimuli applied during a time course series of acquisitions. Each stimulus is applied during data acquisition with a unique predominant repetition rate, or frequency. The resulting time varying NMR signal for each voxel in the MRI data set is Fourier transformed to the frequency domain to produce a corresponding set of transformed MRI in, age data. A brain activity image for any one of the applied stimuli is produced by selecting and displaying the transformed MRI image data which corresponds to the predominant frequency of that one stimulus. In addition, the frequency domain signal for any voxel in the transformed MRI image data set may be displayed directly.

A general object of the invention is to improve the diagnostic value of MRI images of brain activity. Graphic representations of the time varying NMR signal at any location in the brain can be displayed for analysis. Similarly, the frequency domain representation of those signals can also be graphically displayed to reveal the separate frequency components therein.

Another object of the invention is to improve the quality of NMR brain activity images. Better difference images may be produced by enabling better selection of the two MRI image data sets to be subtracted. In addition, however, images with significantly improved signal-to-noise ratio are produced by correlating the time course acquired NMR data for each voxel with a reference pattern or by performing a Fourier transformation of such data and selecting the appropriate frequency component.

Another object of the invention is to use patient activity as a means for improving MRI brain function images. While conventional signal filtering techniques may be used to enhance the acquired MRI image data sets, the present invention overcomes the limitations on such methods by changing the problem from a filtering problem to a pattern recognition problem. In other words, the selected temporal pattern appears in the acquired MRI image data sets and pattern recognition techniques may be used to further enhance image quality.

A more specific object of the invention is to improve MRI brain function images using both state-of-the-art filtering techniques combined with state-of-the-art pattern recognition techniques. Filtering techniques may be used to reduce artifacts in the acquired MRI image data sets caused by patient motion, brain pulsatility, blood flow and CSF flow. The filtered MRI image data sets may then be processed to produce an image based on the correlation of that data with the selected temporal pattern.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

Figure 1:
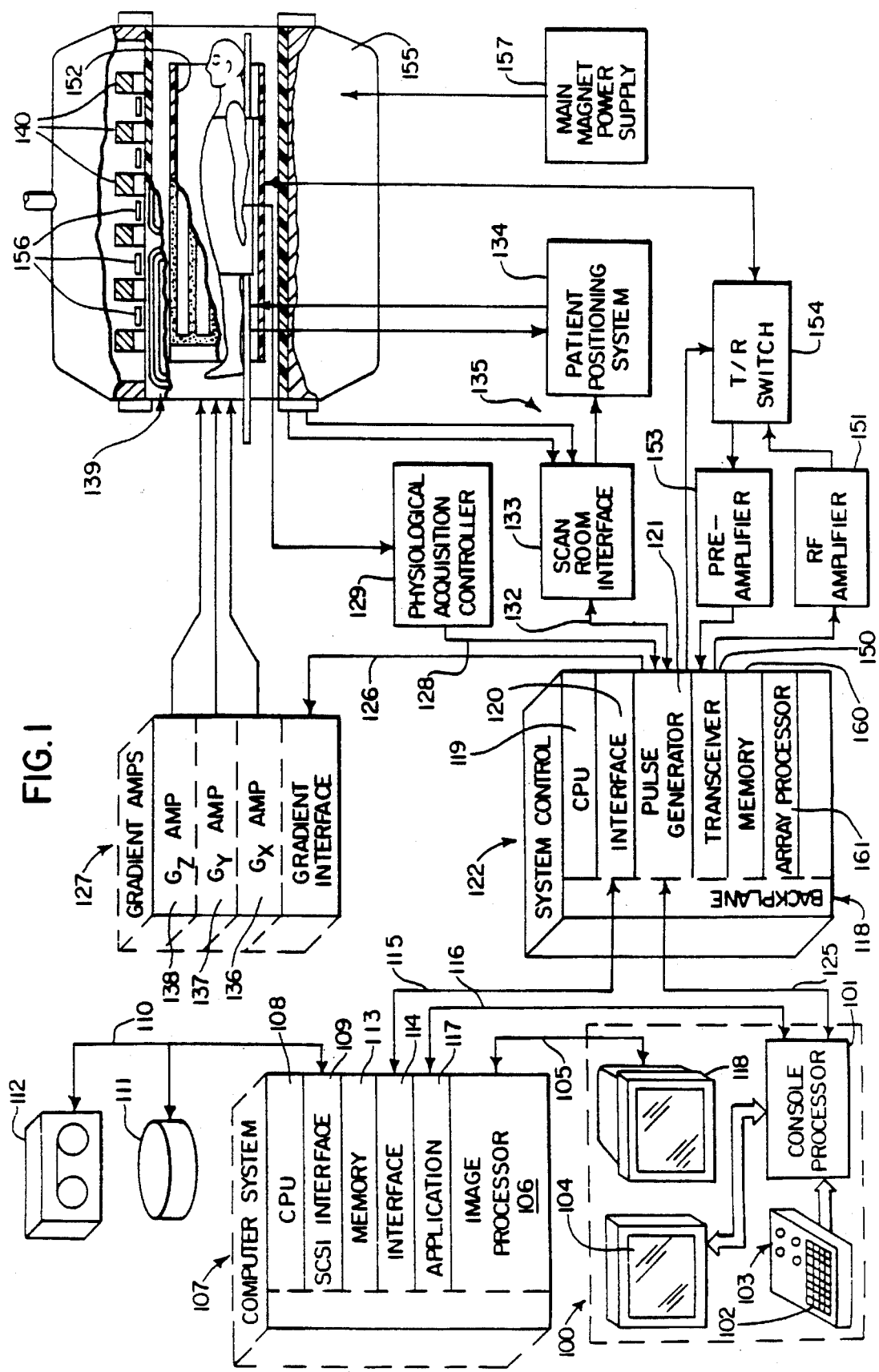
FIG. 1 is a block diagram of an NMR system which employs the present invention.

Blood is a unique source of physiological contrast in MRI due to its oxygenation-sensitive paramagnetic characteristics. Deoxyhemoglobin contains paramagnetic iron, while oxyhemoglobin contains diamagnetic oxygen-bound iron. The partial pressure of oxygen in blood regulates the oxygen saturation of hemoglobin, as described empirically by the oxygen-hemoglobin dissociation curve.

It is well established that the oxygen saturation of hemoglobin affects the $T_2$ of whole blood. The susceptibility differential between the hemoglobin-containing erythrocyte and surrounding plasma creates microscopic field inhomogeneities. Irreversible spin dephasing is caused by exchange of protons across the erythrocyte membrane and/or diffusion of protons through the microscopic magnetic field gradients.

On a larger scale, it has been demonstrated that the paramagnetic contribution of deoxyhemoglobin affects the susceptibility of whole blood, causing it to be less diamagnetic than surrounding tissue. Magnetic field inhomogeneities within and around each vessel are created by this susceptibility differential. A spin-echo signal is attenuated by spin dephasing due to diffusion of spins through field inhomogeneities, while a gradient-echo is additionally attenuated by dephasing due to static field inhomogeneities, independent of diffusion. Changes in $T_2^*$ are observed through the time course collection of images obtained with a long-TE echo-planar imaging (EPI) sequence which samples during the free induction decay. This sequence is referred to as gradient-echo EPI. A long TE enhances the effects of a susceptibility differential by allowing more time for spin dephasing to occur within a voxel.

we have discovered that time course, long-TE, gradient-echo EPI is an effective tool in localizing brain function in humans. Signal increases that occur during task activation are observed to be predominantly in areas of the brain functionally associated with the task. Images are created in which these regions of temporally correlated signal enhancement are highlighted.

Data acquisition is performed on a standard clinical NMR system using local gradient coils designed for rapid gradient switching. A blipped, gradient-echo EPI pulse sequence, having an initial π/2 pulse and an effective TE (($k_x$, $k_y$)=(0,0)) of 50 ms, was employed. The acquisition time was 40 ms for each 64×64 image, and was centered at the effective TE. All displayed images were linearly interpolated to a 256×256 matrix. A time course series of 128 sequential images of the same plane was obtained using an interscan delay (TR) of 2 to 3 seconds. Slice thickness was 25 mm to ensure that the activated region of the brain was completely contained in the slice. The head of the subject was immobilized by tightly packed foam rubber cushions.

Each time course series of 128 images was obtained during a procedure of three segments. During the first and last segments, the subject was instructed to remain completely relaxed. During the middle segment, the subject was instructed to perform a function in a repetitive manner or was stimulated in a repetitive manner and the time course MRI data was acquired.

The time varying NMR signal produced by a voxel may be plotted as a function of time by using the corresponding voxel intensity value from each of the successive 128 sequential images. We refer to these values as a time domain voxel vector, and one or more of these vectors can be displayed in graphic form to determine if it varies in synchronism with the repetitive function or applied stimulation. We have discovered that considerable information can be derived from a display in which the brain is shown anatomically using one of the acquired image data sets, and time domain voxel vectors are simultaneously displayed in graphic form for voxels indicated by a movable cursor.

The graphic display of time domain voxel vectors enables the neurologist to select two or more of the 128 images from the time course MRI data and produce a brain function image using the subtraction method. The cursor is moved over the anatomical picture of the brain until the graph of a voxel vector is found which clearly shows the repetitive pattern of the applied stimulus. From this graph MRI image data acquired when the stimulus was not applied can easily be identified and selected. Similarly, MRI image data acquired when the stimulus was applied may be identified on the graph and a difference image can be produced using the two separately selected sets of MRI image data. The difference image may be produced by subtracting the magnitudes of corresponding voxels in two MRI image data sets or by subtracting average values from more than two of the acquired MRI image data sets. These difference values are mapped onto a color scale and are combined with the anatomical grey scale brain image to show the neurologist where and to what extent brain activity has occurred.

Two methods have been discovered in which the entire set of 128 images can be used to significantly improve the quality of brain function images. In one method, each time domain voxel vector is transformed to a frequency domain voxel vector using a Fourier transformation. Data comprised of 128 2D arrays is produced, with each 64×64 element 2D array indicating the magnitude of signal at a particular frequency. The 2D array corresponding to the frequency of the applied stimulation produces an image which indicates the intensity of this particular brain function at each of its 64×64 voxels. This method enables data to be acquired for a number of different functions during a single time course series by stimulating each function at a different frequency.

In the correlation technique a time domain voxel vector is chosen as a model, or reference pattern, which is representative of a brain region that is active in response to the stimulus. This reference voxel vector can be created from knowledge of the selected temporal stimulation pattern, or it can be chosen as one of the time domain voxel vectors in the time course data which is deemed most representative of the stimulated brain function. This is easily accomplished by moving the cursor on the anatomical image and examining the displayed graphs as described above. The dot product of this reference voxel vector with each of the other time domain voxel vectors is calculated, and the degree of correlation modulates the intensity or color of the corresponding voxel. The benefits of this correlation technique are further magnified when used in combination with filtering techniques such as thresholding and masking.

DESCRIPTION OF THE PREFERRED EMBODIMENT

Referring first to FIG. 1, there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 is formed about a backplane bus which conforms with the VME standards, and it includes a number of modules which communicate with each other through this backplane. In addition to the application interface 117 and the image processor 106, these include a CPU module 108 that controls the VME backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 also connects through serial link 126 to a set of gradient amplifiers 127, and it conveys data thereto which indicates the timing and shape of the gradient pulses that are to be produced during the scan. The pulse generator module 121 also receives patient data through a serial link 128 from a physiological acquisition controller 129. The physiological acquisition control 129 can receive a signal from a number of different sensors connected to the patient. For example, it may receive ECG signals from electrodes or respiratory signals from a bellows and produce pulses for the pulse generator module 121 that synchronizes the scan with the patient's cardiac cycle or respiratory cycle. And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 155 which includes a polarizing magnet 140 that produces a 1.5 Tesla polarizing field that extends horizontally through a bore. The gradient coils 139 encircle the bore, and when energized, they generate magnetic fields In the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_O$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x,y,z) in the bore of the magnet assembly 141 is given by $B(x,y,z) = B_O + G_x x + G_y y G_z z$. The gradient magnetic fields are utilized to encode spatial information into the NMR signals emanating from the patient being scanned. Because the gradient fields are switched at a very high speed when an EPI sequence is used to practice the preferred embodiment of the invention, local gradient coils are employed in place of the whole-body gradient coils 139. These local gradient coils are designed for the head and are in close proximity thereto. This enables the inductance of the local gradient coils to be reduced and the gradient switching rates increased as required for the EPI pulse sequence. For a description of these local gradient coils which is incorporated herein by reference, see copending U.S. patent application Ser. No. 08,006,219 filed on even date herewith and entitled "NMR Local Coil For Brain Imaging".

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154 which forms an integral part of the RF coil assembly. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150.

The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate local RF head coil to be used in the transmit and receive mode to improve the signal-to-noise ratio of the received NMR signals. With currently available NMR systems such a local RF coil is necessary in order to detect the small variations in NMR signal produced by brain functions. Reference is made to the above cited copending U.S. Patent Application for a description of the preferred local RF coil.

In addition to supporting the polarizing magnet 140 and the gradient coils 139 and RF coil 152, the main magnet assembly 141 also supports a set of shim coils 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil are digitized by the transceiver module 150 and transferred to a memory module 160 which is also part of the system control 122. When the scan is completed and an entire array of data has been acquired in the memory modules 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the video display 118 as will be described in more detail hereinafter.

Figure 2:
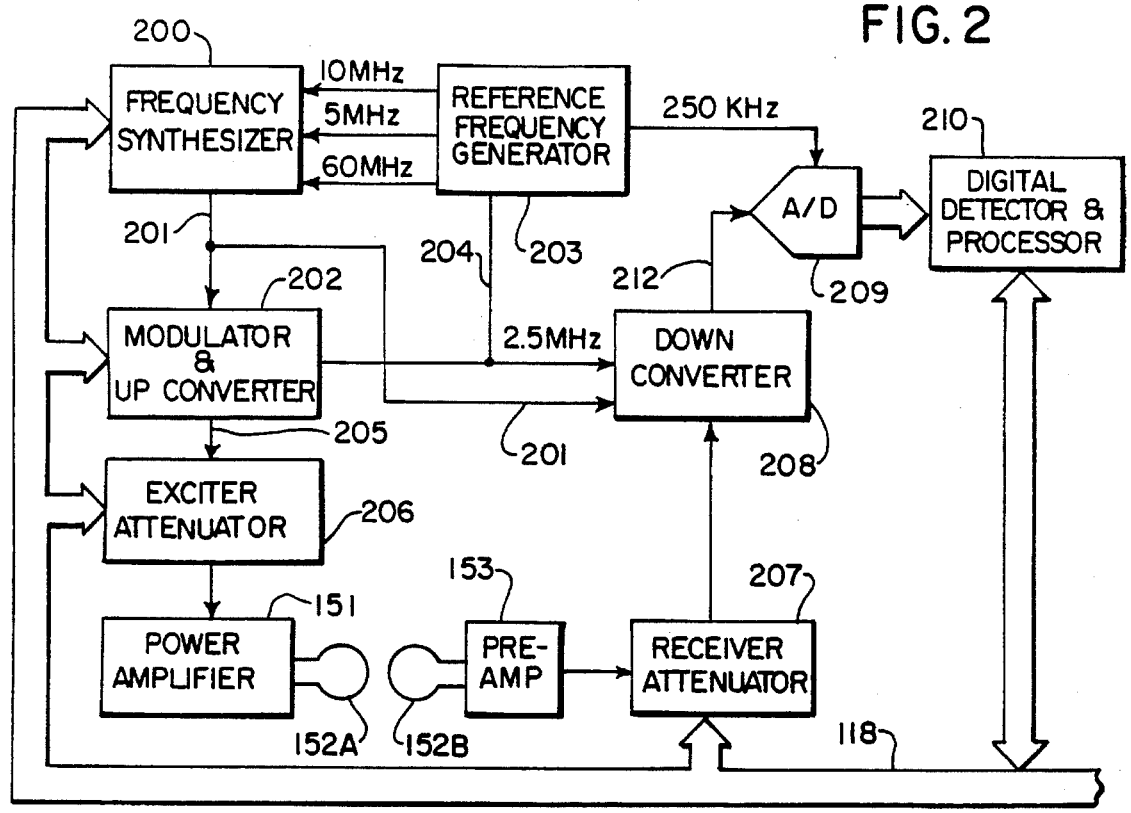
FIG. 2 is an electrical block diagram of the transceiver which forms part of the NMR system of FIG. 1.

Referring particularly to FIGS. 1 and 2, the transceiver 150 includes components which produce the RF excitation field $B_1$ through power amplifier 151 at a coil 152A and components which receive the resulting NMR signal induced in a coil 152B. As indicated above, the coils 152A and B may be a single whole-body coil, but the best results are achieved with a single local RF coil specially designed for the head. The base, or carrier, frequency of the RF excitation field is produced under control of a frequency synthesizer 200 which receives a set of digital signals (CF)

through the backplane 118 from the CPU module 119 and pulse generator module 121. These digital signals indicate the frequency and phase of the RF carrier signal which is produced at an output 201. The commanded RF carrier is applied to a modulator and up converter 202 where its amplitude is modulated in response to a signal R(t) also received through the backplane 118 from the pulse generator module 121. The signal R(t) defines the envelope, and therefore the bandwidth, of the RF excitation pulse to be produced. It is produced in the module 121 by sequentially reading out a series of stored digital values that represent the; desired envelope. These stored digital values may, in turn, be changed from the operator console 100 to enable any desired RF pulse envelope to be produced. The modulator and up converter 202 produces an RF pulse at the desired Larmor frequency at an output 205.

The magnitude of the RF excitation pulse output through line 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the NMR signal produced by the subject is picked up by the receiver coil 152B and applied through the preamplifier 153 to the input of a receiver attenuator 207. The receiver attenuator 207 further amplifies the NMR signal and this is attenuated by an amount determined by a digital attenuation signal (RA) received from the backplane 118. The receive attenuator 207 is also turned on and off by a signal from the pulse generator module 121 such that it is not overloaded during RF excitation.

The received NMR signal is at or around the Larmor frequency, which in the preferred embodiment is around 63.86 MHz for 1.5 Tesla. This high frequency signal is down converted in a two step process by a down converter 208 which first mixes the NMR signal with the carrier signal on line 201 and then mixes the resulting difference signal with the 2.5 MHz reference signal on line 204. The resulting down converted NMR signal on line 212 has a maximum bandwidth of 125 kHz and it is centered at a frequency of 187.5 kHz. The down converted NMR signal is applied to the input of an analog-to-digital (A/D) converter 209 which samples and digitizes the analog signal at a rate of 250 kHz. The output of the A/D converter 209 is applied to a digital detector and signal processor 210 which produce 16-bit in-phase (I) values and 16-bit quadrature (Q) values corresponding to the received digital signal. The resulting stream of digitized I and Q values of the received NMR signal is output through backplane 118 to the memory module 160 where they are employed to reconstruct an image.

To preserve the phase information contained in the received NMR signal, both the modulator and up converter 202 in the exciter section and the down converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by the reference frequency generator 203 from a common 20 MHz master clock signal. The latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
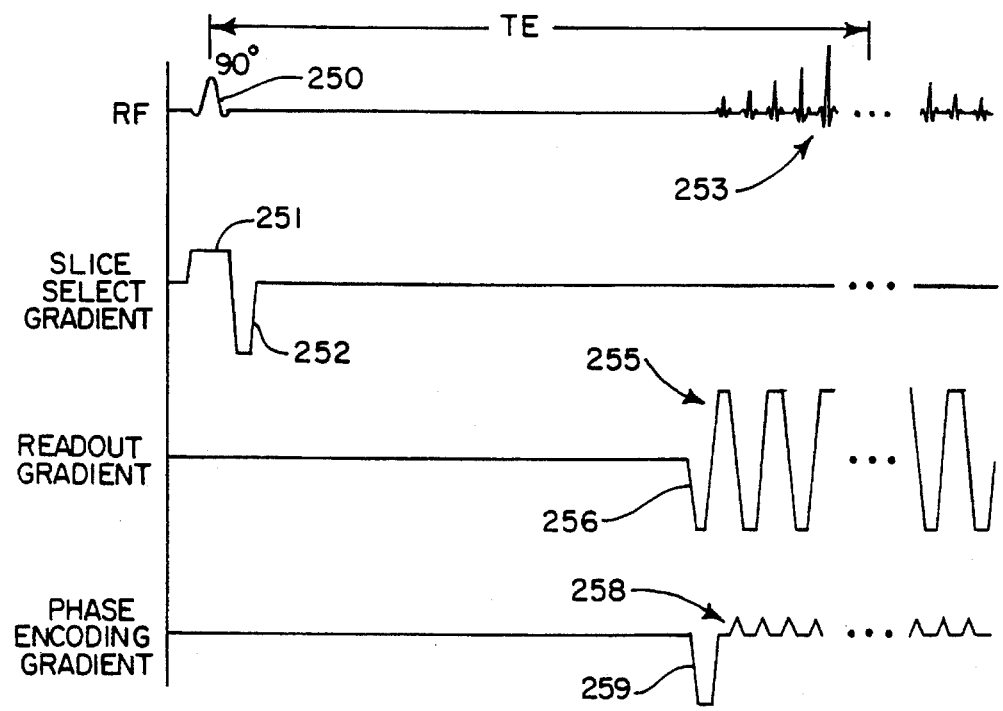
FIG. 3 is a graphic representation of the EPI pulse sequence used to practice the present invention on the NMR system of FIG. 1.

The EPI pulse sequence employed in the preferred embodiment of the invention is illustrated in FIG. 3. A 90° RF excitation pulse 250 is applied in the presence of a $G_z$ slice select gradient pulse 251 to produce transverse magnetization in a slice through the brain ranging from 4 to 25 mm thick. The excited spins are rephased by a negative lobe 252 on the slice select gradient $G_z$ and then a time interval elapses before the readout sequence begins. A total of 128 separate NMR echo signals, indicated generally at 253, are acquired during the EPI pulse sequence. Each NMR echo signal 253 is a different view which is separately phase encoded to scan $k_y$-space from $k_y=-32$ to $k_y=+32$ in monotonic order. The readout sequence is positioned such that the view acquired at $k_y=0$ occurs at the desired echo time (TE). While echo times may range from TE=20 to 120 ms, in brain studies the best functional images have been obtained with echo times of 40 to 50 ms.

The NMR echo signals 253 are gradient recalled echo's produced by the application of an oscillating $G_x$ readout gradient field 255. The readout sequence is started with a negative readout gradient lobe 256 and the echo signals 253 are produced as the readout gradient oscillates between positive and negative values. A total of 64 samples are taken of each NMR echo signal 253 during each 512 microsecond readout gradient pulse 255. The successive 64 NMR echo signals 253 are separately phase encoded by a series of $G_y$ phase encoding gradient pulses 258. The first pulse is a negative lobe 259 that occurs before the echo signals are acquired to encode the first view at $k_y=-32$. Subsequent phase encoding pulses 258 occur as the readout gradient pulses 255 switch polarity, and they step the phase encoding monotonically upward through $k_y$ space.

At the completion of the EPI pulse sequence, therefore, 64 separate frequency encoded samples of 64 separately phase encoded NMR echo signals 253 have been acquired. This 64×64 element array of complex numbers is Fourier transformed along both of its dimensions ($k_y$ and $k_x$) to produce a 64×64 element array of image data that indicates the NMR signal magnitude along each of its two dimensions (y and x).

A complete scan is performed in which the EPI pulse sequence is repeated 128 times to acquire time course NMR data for 128 images. The EPI pulse sequences are spaced apart in 2 to 3 second intervals such that the entire time I0 course acquisition spans a 4 to 6 minute time period. During that time period the subject is asked to perform a specific function in a predetermined pattern, or a stimulus is applied to the subject in a predetermined pattern. For example, the subject may be instructed to touch each finger to his thumb in a sequential, self-paced, and repetitive manner, or the subject may be subjected to a sensory stimulus such as a smell or visual pattern in a periodic manner. More than one such experiment may be conducted during the scan by varying the repetition rate, phase, or frequency, of the applied stimulus or performed function so that they can be discriminated on the basis of the frequency difference.

The acquired NMR data is processed in the conventional manner to produce an NMR image data set for 128 images. As explained above, a two dimensional Fourier transformation is performed by the array processor 161 (FIG. 1) and the resulting NMR image data set is stored in the disk 111 for further processing by the image processor 106 according to the present invention.

Figure 4A:
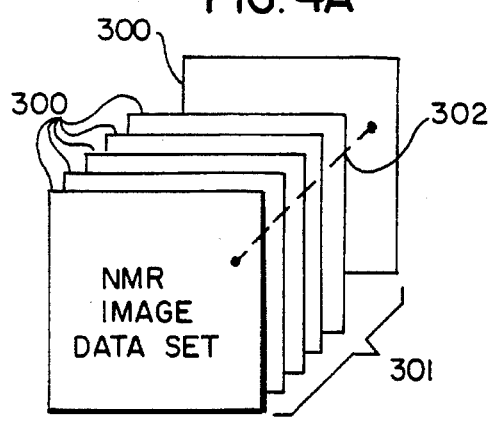
FIG. 4A is a pictoral representation of the NMR image data acquired with the pulse sequence of FIG. 3.

Referring to FIG. 4A, this NMR image data set is organized as a set of 64×64 element 2D arrays 300 in which each element stores the magnitude of the NMR signal from one voxel in the scanned slice. Each array 300 can be used to directly produce a 256×256 pixel anatomical image of the brain slice for output to the video display 118. While each array 300 is a "snap shot" of the brain slice at a particular time during the time course study, the NMR image data set may also be viewed as a single 64×64×128 3D array 301 in which the third dimension is time.

Figure 4B:
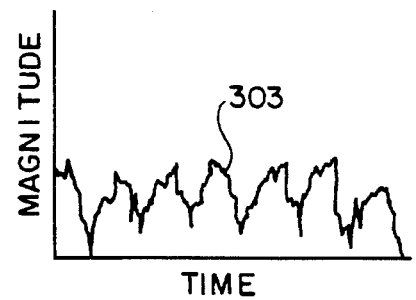
FIG. 4B is a graphic representation of a time domain voxel vector which forms part of the data set of FIG. 4A.

The time course NMR image data for one voxel in the array 301 is referred to herein as a time course voxel vector. One such 128 element vector is illustrated in FIG. 4A by the dashed line 302. Each time course voxel vector 302 indicates the magnitude of the NMR signal at a voxel in the image slice over the time course study. It is used to produce a graphic display as shown in FIG. 4B. The resulting time domain voxel graph 303 reveals very clearly variations in the activity of the brain in the region of the voxel. Regions which are responsive to a sensory stimulus, for example, can be located by identifying time domain voxel graphs which vary at the same repetition rate as the applied stimulus. This search is facilitated by the display process described below.

Figure 4C:
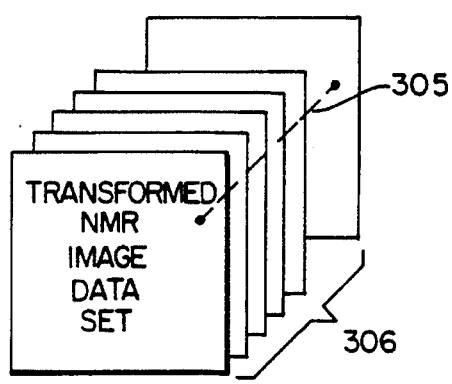
FIG. 4C is a pictoral representation of a transformed NMR image data set produced from the data set of FIG. 4A.

The NMR image data set 301 may be further processed by performing a one dimensional Fourier transformation of each time domain voxel vector 302 to produce a corresponding frequency domain voxel vector as shown by dashed line 305 in FIG. 4C. These may be stored as a 64×64×128 element transformed NMR image data set 306 in which each 64×64 element array therein indicates the NMR signal magnitudes in the image slice at a particular frequency. For example, the first array in the transformed NMR image data set 306 will produce an image which indicates the magnitude of the dc component of the NMR signal at each voxel, whereas the last array in the data set 306 indicates components at a high repetition rate, or frequency. An image of the brain functions which occur in response to a particular stimulus can, therefore, be produced by selecting the 64×64 element array from the transformed data set 306 which corresponds to the repetition rate of the applied stimulus. In addition, if two or more stimuli are applied at different repetition rates, the brain's response can be frequency discriminated by selecting the transformed image data array which corresponds in frequency to each stimulus application rate.

Figure 4D:
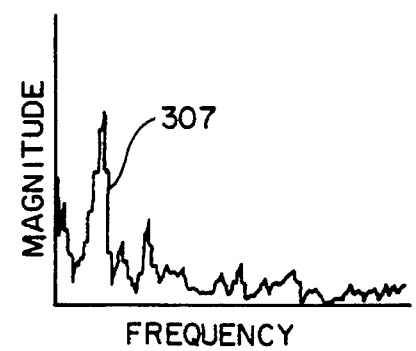
FIG. 4D is a graphic representation of a frequency domain voxel vector which forms part of the data set of FIG. 4C.

Frequency domain voxel vectors 305 can be graphed and displayed as shown in FIG. 4D. The resulting frequency domain voxel graph 307 indicates the magnitude of each frequency component in the time course NMR data for the voxel. If the frequency component corresponding to the frequency of the applied stimulus is high, that portion of the brain was very active. As will be described below, the frequency domain, voxel graph 307 is useful in locating active regions and in selecting a particular array from the transformed NMR image data set 306 for display.

The display process is performed by programs executed in the image processor 106 and in response to commands received from the operator. The images are produced as separate windows on the video display 118 and a cursor in each window may be manipulated using a track ball on the control panel 103. The display process will now be described with reference to the flow chart of FIG. 6.

Figure 5A:
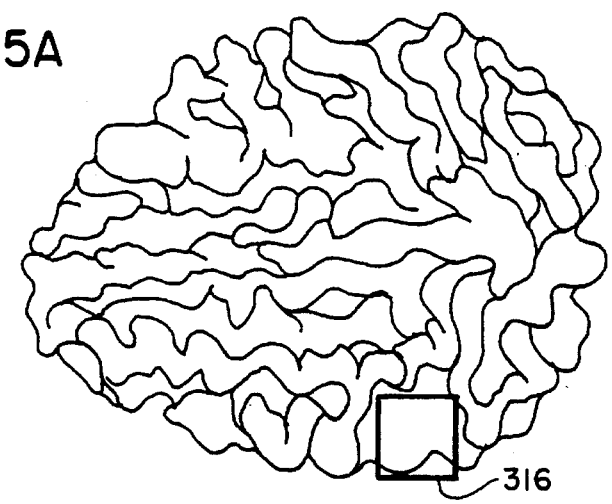
FIG. 5A is a pictoral view of an anatomical image which is produced on a display in the NMR system of FIG. 1.
Figure 5B:
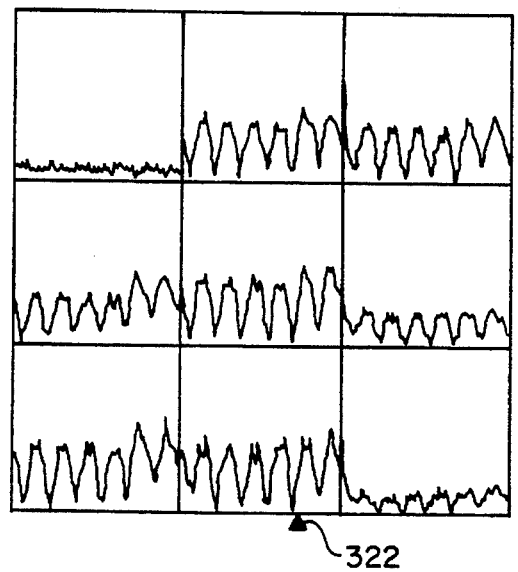
FIG. 5B is a pictoral view of an image produced on the display of FIG. 1 showing a time domain voxel vector in graphic form.

When the brain function imaging mode is entered the first 64×64 voxel array is read from the NMR image data set 301 and projected on the video display 118 as a 256×256 pixel image. As indicated by process block 315, this anatomical image of the brain is produced by linearly interpolating between the 64×64 voxel values in the 2D image array 300. Such an anatomical display of the brain is illustrated in FIG. 5A, and while the quality of the image is not the best, it is sufficient to enable a neurologist to accurately place a cursor 316 over the area in the brain to be examined. As indicated by decision block 317, the operator then chooses between time domain and frequency domain data. If time domain data is selected the operator then sets the desired size of the cursor 316 at process block 318 and the time domain graphs for the voxels enclosed by the cursor 316 are displayed in a separate window of the video display 118 as indicated at process block 319. Such a display for a 3×3 voxel patch is shown in FIG. 5B, where each of the nine squares contains a plot of a corresponding time domain voxel vector. In this example, the cyclic pattern apparent in the center voxel corresponds in frequency to the repetitive application of a smell stimulation to the subject. Notice that some of the adjacent voxels also display this pattern and some do not, and that this is quite easy to determine. The areas of the brain which function in response to a stimulant are thus easy to see. The number of voxels enclosed by the cursor 316 is adjustable and may vary from 1 to 100.

Referring again to FIG. 6, the cursor 316 may be moved over the anatomical brain image to explore other time domain voxel vectors. If this is done, as indicated at decision block 320, the system branches back to process block 319 to display the newly selected window of voxel data. Movement of the cursor 316 can be performed in either of two ways. The first is to directly move the cursor 316 with a track ball and the second is to "click" on one of the squares other than the center square in the window of FIG. 5B. In the latter case, the cursor 316 is moved such that the selected voxel is now displayed in the center square in the window of FIG. 5B.

After viewing different areas of the brain either of two procedures for producing brain function images can be selected using the time domain data in the NMR image data set 301. The first is a simple difference image that is selected by the operator at decision block 321. With this procedure the operator is prompted to select at least two of the 2D arrays 300 in the data set 301 using a cursor 322 that may be moved along the lower boarder of the window of FIG. 5B. The operator would select one 2D array 300 that is acquired when stimulation is applied and a second 2D array 300 that is acquired when there is no stimulation. With reference to the center voxel graph in FIG. 5B, one 2D array 300 would be selected, for example, at the center of a peak in the periodic waveform and the other would be selected in the middle of a valley. In the alternative, more than one 2D array may be chosen and averaged together to improve the SNR of the resulting functional image. The display of the time domain voxel vector enables the operator to accurately select a large number of 2D arrays to form two averaged image arrays: one indicative of brain activity when the stimulus is applied; and a second indicative of baseline brain activity.

Figure 7:
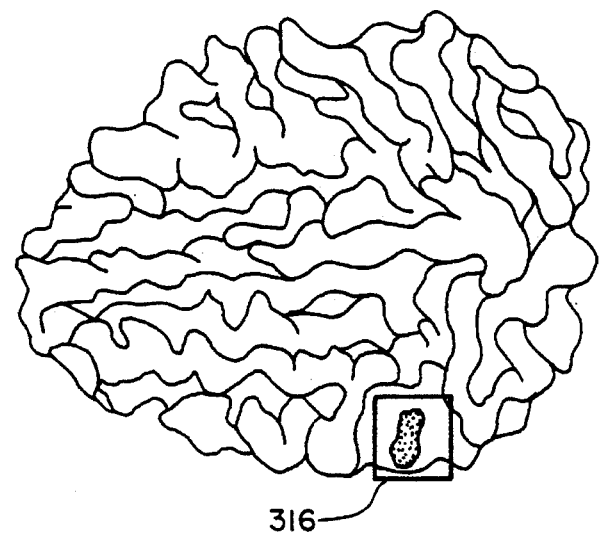
FIG. 7 is a pictoral view of brain function image superimposed on a brain anatomical image produced on the video display of FIG. 1.

After the two image arrays are formed by the selections at process block 323, a difference image is produced by subtracting the values of their corresponding voxels as indicated at process block 324. The resulting 64×64 voxel difference array may then be linearly interpolated to form a 256×256 pixel brain function image. Each voxel in the difference array indicates the difference in NMR signal strength produced by the corresponding region of the brain when the stimulation is applied and removed from the subject. As indicated at process block 325, this brain function image is superimposed on the anatomical brain image to indicate where brain activity is occurring. This superimposition can be a simple adding of corresponding pixel values in the anatomical image and the brain function image to produce the resulting brightness image shown in FIG. 7. In the alternative, the brain function image values can be used to control the intensity of a different color or to modulate the color of the image pixels. These display techniques are commonly used with other medical imaging modalities such as images produced by PET scanners. After the image is produced, the process may be repeated as determined at decision block 326 in response to a command from the operator, or the process is terminated.

It is an important advantage of the present invention that the brain function image is perfectly registered with the underlying anatomical image. This results, of course, from the fact that the two images are produced from the same time course MRI data set.

Figure 6:
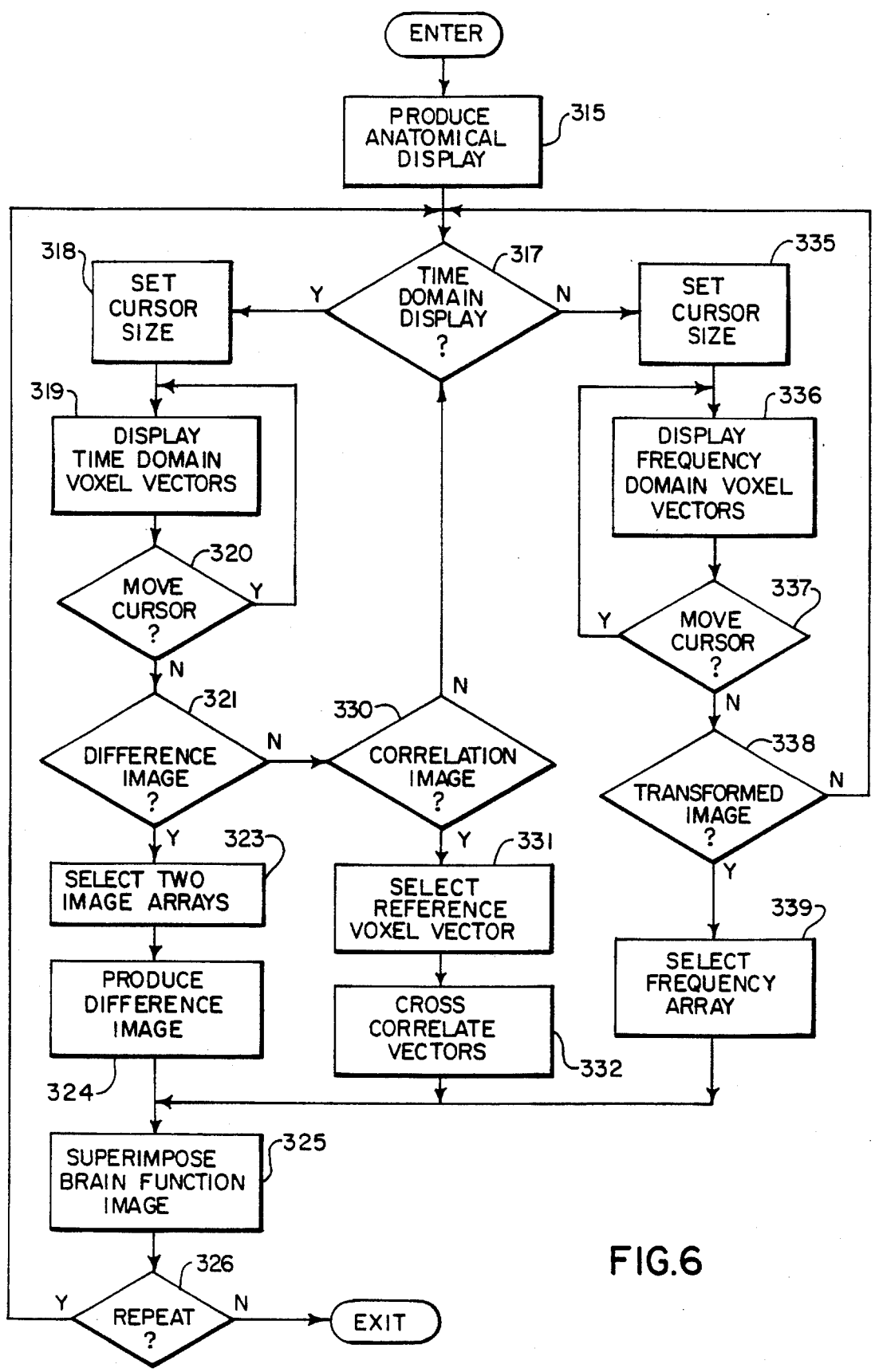
FIG. 6 is a flow chart of a program executed by a computer which forms part of the NMR system in FIG. 1 to enable an operator to analyze the acquired NMR image data of FIGS. 4A and 4C and to produce brain function images.

Referring particularly to FIG. 6, the operator may also choose to produce a correlation image from the NMR image data set 301. This is determined at decision block 330 and the operator is prompted to select one of the time domain voxel vectors as a reference at process block 331. The center voxel in the window of FIG. 5B might be chosen, for example, because it is believed to best represent a time domain voxel vector for a region of the brain which is active in response to the selected temporal pattern being used. In the alternative, a reference voxel vector can be manually synthesized to represent the ideal response to the selected stimulation or function pattern. In either case, the 128 element reference voxel vector is correlated with each of the time domain voxel vectors 300 in the NMR image data set 301 as indicated at process block 332.

This correlation operation may be performed in different ways. The objective, however, is to measure the degree to which each time domain voxel vector resembles, or matches, the pattern of the reference voxel vector. In the preferred embodiment this is accomplished by the process shown in FIG. 8.

As indicated by process block 350, a copy of the time course NMR image data set 301 is made and a number of conventional filtering and thresholding procedures are applied at process block 351. Such procedures remove known artifact patterns such as those caused by patient motion during the scan, pulsatile motion of the brain during the scan, and artifacts caused by flowing blood and CSF fluid. These known artifact patterns can produce intense signal levels which can overpower the pattern recognition procedures to follow.

Figure 8:
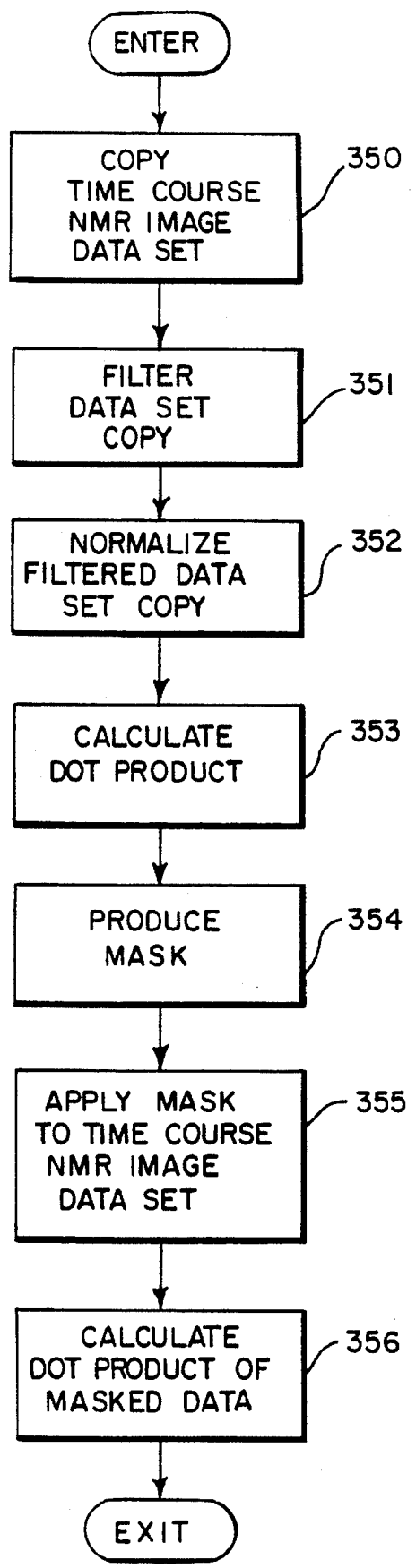
FIG. 8 is a flow chart of a program executed by the computer in FIG. 1 which performs the cross correlation process in the flow chart of FIG. 6.

Referring still to FIG. 8, each time domain NMR data set is normalized as indicated at process block 352. Normalization is performed by finding the square root of the sum of the squares of each magnitude in the voxel vector and then dividing each magnitude by the summation. This normalization in essence converts each time domain voxel vector to a unit vector. The selected reference voxel vector is also normalized, and as indicated at process block 353, the vector product, or dot product is calculated for each normalized time domain vector and the normalized reference voxel vector. This dot product is a value which indicates the degree of similarity between the vectors. These values are thresholded at process block 354 to identify each voxel vector which fails to meet a threshold value of similarity. This threshold value can be manually changed by the operator and a 64×64 element mask is produced in which each element therein corresponds to one of the voxel vectors. Those elements corresponding to voxel vectors which did not meet the threshold value are set to "zero" and those that did are set to "one". This mask is then applied at process block 355 to the original time course NMR image data set 301 to eliminate, or filter out, all time domain voxel vectors therein which correspond to the "zeros" in the mask.

The mask produced according to the present invention differs from prior thresholding techniques in that the shape of the voxel vector is an important consideration in whether the voxel is to be masked out or not.

The final step in the cross correlation process is to apply the reference voxel vector to this masked time course NMR data set. This is indicated at process block 356 where the vector product, or dot product, of the reference voxel vector and each of the time domain voxel vectors in the masked time course NMR data set is computed. More specifically, the corresponding elements in the two vectors are multiplied and the products summed. These correlation magnitudes are scaled to a range of 0 to 256. The resulting 64×64 array of scaled correlation magnitudes may be used to produce a brain function image directly, or it may be linearly interpolated to produce a 256×256 pixel brain function image that is superimposed as described above with the anatomical brain image.

Figure 5C:
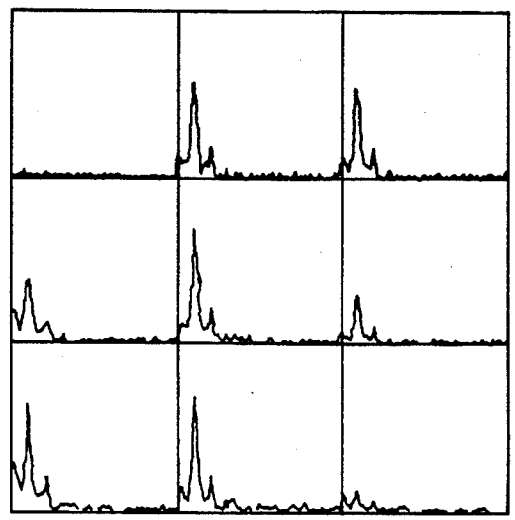
FIG. 5C is a pictoral view of an image produced on the display of FIG. 1 showing a frequency domain voxel vector in graphic form.

The operator may also elect to use the frequency domain NMR image data in the data set 306 (FIG. 4C) to analyze the results of the scan and produce a brain function image. Referring particularly to FIG. 6, the election is detected at decision block 317 and the size of the cursor 316 (FIG. 5A) is set as before at process block 335. The frequency domain voxel vector 305 for the voxels bounded by the cursor 316 are then displayed as a matrix of graphs as shown in FIG. 5C and indicated at process block 336. The anatomical image of the brain slice of FIG. 5A is thus produced on the display 118, and in a separate window, the frequency spectrum graphs 307 of the identified area are produced. While nine voxels are shown in FIG. 5C, the number of voxels shown may be increased or decreased. The cursor 316 may be moved about the anatomical image as described above and as detected at decision block 337, and at some point a decision is made at block 338 to quit or proceed to produce an image.

As indicated at process block 339 and shown in FIG. 5C, the production of an image from the transformed NMR image data set 306 begins by selecting one of the 64×64 element 2D arrays of spectral density data. This may be accomplished by moving a cursor 340 along the horizontal, frequency axis of the display in FIG. 5C and "clicking" on the desired frequency component. The frequency of the applied stimulus is known and the spectral component at this frequency is easily identified in the frequency spectrum graph, particularly if an active voxel is being displayed at the center of the window. Once this selection is made, the corresponding 2D array of spectral density data is read from the transformed NMR image data set 306 and it is superimposed on the anatomical brain image as described above for process block 325 and as shown in FIG. 7. As indicated previously, this particular method for producing brain function images is useful when more than one stimulus is applied during the data acquisition scan. The functional response of the brain can be displayed separately for each stimulus by selecting the 2D array which corresponds in frequency to that of the applied stimulus. The display of FIG. 5C is very useful in making this selection. Also, this technique requires less intervention and decision making by the operator, thus improving the efficiency of the procedure.

A brain function imaging system has been described which enables NMR data to be acquired in a few minutes and which enables the neurologist to view brain function data in noninvasive and probative ways. A number of different brain function images can be produced using different filtering and pattern recognition strategies.

For example, the production of a mask as described above in connection with the cross correlation method of brain function image construction can also be applied to the difference method and the frequency domain methods. When applied to the difference method, a mask is produced as described above with reference to FIG. 8. This mask is applied to each of the two image arrays formed by the selections at process block 323 (FIG. 6) before they are subtracted from one another. Similarly, such a mask may be applied to the 2D array of spectral density data selected at process block 339 prior to its display. Also, while the preferred embodiment of the mask is binary (i.e. "ones" and "zeros") it is also possible to produce a mask having more than two values. This "segmentation" is accomplished by establishing more than one threshold value and setting the value in the mask depending on which threshold values are met at each voxel.

Also, the cross correlation method described above with respect to FIG. 8 may be applied to the transformed NMR image data set. In this embodiment, a frequency domain reference voxel vector is selected from the data set 306 or one is synthesized. The dot product of this frequency domain reference voxel vector and the masked, transformed NMR image data set 306 is then calculated for each voxel to produce a brain function image.

It can be appreciated by those skilled in the art that many variations can be made from the preferred embodiment without departing from the spirit of the invention. For example, while a particular EPI pulse sequence has been described, others are possible. For example, spin-echo EPI may be used in place of the preferred gradient-echo EPI pulse sequence, and multiple slices may be acquired during the time course acquisition, or a 3D data set may be acquired using echo volume imaging pulse sequences. When 3D data of the brain is acquired it can be mapped to a 2D flat map of the brain. One of the advantages of the present invention is that the brain function data may be mapped from 3D to a 2D flat map and registered perfectly with the similarly produced anatomical flat map of the brain. Also, an improved anatomical image can be produced by using a conventional NMR pulse sequence, such as spin warp, either before or after the time course acquisition. Since the same gradient coils are used to acquire the anatomical data and the brain function data, perfect alignment, or register, of the two superimposed images is achieved.

It can also be appreciated by those skilled in the art that many different filtering strategies can be used with the present invention. Also, other pattern recognition strategies may be used. More sophisticated techniques such as principle component analysis may be used to extract a reference voxel vector from the acquired time course NMR image data.

We claim:

1. A method for producing an NMR brain function image, the steps comprising:

acquiring a series of NMR image data arrays over a period of time during which the subject's brain is caused to function in a preselected temporal pattern to form a time course NMR image data set, the time course NMR image data set forming a set of time domain voxel vectors in which each time domain voxel vector indicates the NMR signal from a different region of the brain during said period of time;

establishing a reference time domain voxel vector which is representative of the NMR data produced by an active region of the brain during the acquisition of the time course NMR image data set;

producing a correlation image by calculating the dot product of the reference time domain voxel vector with respective time domain voxel vectors in the time course NMR image data set; and displaying the correlation image as a brain function image.

2. The method as recited in claim 1 in which the reference time domain voxel vector is established by selecting a time domain voxel vector from the time course NMR image data set.

3. The method as recited in claim 1 in which the time course NMR image data set is acquired by performing a series of echo planar imaging pulse sequences on an NMR system.

4. The method as recited in claim 1 in which the brain is caused to function in said preselected temporal pattern by repetitively applying a stimulus to the subject at a relatively constant rate.

5. The method as recited in claim 1 in which the brain is caused to function in said preselected temporal pattern by causing the subject to repetitively perform a task at a relatively constant rate.

6. The method as recited in claim 1 in which the brain function image is displayed by superimposing it on an anatomical image of the brain produced from data in the time course NMR image data set.

7. The method as recited in claim 1 which includes filtering the time course NMR image data set prior to producing the correlation image.

8. The method as recited in claim 7 in which said filtering includes the steps of:

normalizing each time domain voxel vector in a copy of the time course NMR image data set;

calculating the dot product of the reference time domain voxel vector with respective normalized time domain voxel vectors;

producing a mask array by setting elements therein to values determined by the value of the dot product of corresponding normalized time domain voxel vectors; and applying the mask array to the time course NMR image data set prior to producing the correlation image.

9. A method for producing an NMR image, the steps comprising:

acquiring a series of NMR image data arrays over a period of time during which the subject is caused to function in a preselected temporal pattern to form a time course NMR image data set, the time course NMR image data set forming a set of time domain voxel vectors in which each time domain voxel vector indicates the NMR signal from a different region of the subject during said period of time;

reconstructing an anatomical image of the subject from acquired NMR data;

establishing a reference time domain voxel vector which is representative of the NMR data produced by a region of the subject during the acquisition of the time course NMR image data set;

producing a mask by calculating the dot product of the reference time domain voxel vector with respective time domain voxel vectors in the time course NMR image data set and comparing each dot product with a threshold value; and combining the mask with the anatomical image of the subject to display regions of the subject which correspond with the regions in which the dot product exceeds the threshold value.

* * * * *

UNITED STATES PATENT AND TRADEMARK OFFICE
CERTIFICATE OF CORRECTION

PATENT NO.    : 5,603,322
DATED         : February 18, 1997
INVENTOR(S)   : Jesmanowicz et al.

It is certified that error appears in the above-identified patent and that said Letters Patent is hereby corrected as shown below:

Title page,
Item [62], "Division of Ser. No. 5,723, Jan. 19, 1994." should be -- Division of Ser. No. 5,723, Jan 19, 1993. --.

Column 1,
Lines 4-5, "This is a division of application Se. No. 08/005,723 filed Jan. 19, 1994." should be -- This is a division of application Serial No. 09/005,723 filed Jan. 19, 1993. --

Signed and Sealed this

Fourth Day of May, 2004

JON W. DUDAS
*Acting Director of the United States Patent and Trademark Office*